United States Patent
Hwang et al.

(10) Patent No.: US 7,582,366 B2
(45) Date of Patent: Sep. 1, 2009

(54) DIFLUOROPYRIDINE-BASED COMPOUND AND ORGANIC ELECTROLUMINESCENT DEVICE USING THE SAME

(75) Inventors: Seok-Hwan Hwang, Suwon-si (KR); Young-Kook Kim, Suwon-si (KR); Chang-Ho Lee, Suwon-si (KR); Seok-Jong Lee, Suwon-si (KR); Seung-Gak Yang, Suwon-si (KR); Hee-Yeon Kim, Suwon-si (KR); Jung-Han Shin, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 483 days.

(21) Appl. No.: 11/376,323

(22) Filed: Mar. 16, 2006

(65) Prior Publication Data

US 2007/0015003 A1    Jan. 18, 2007

(30) Foreign Application Priority Data

Jul. 15, 2005    (KR) .................. 10-2005-0064057

(51) Int. Cl.
*H01L 51/54* (2006.01)
*C07D 213/00* (2006.01)
*C07D 403/00* (2006.01)

(52) U.S. Cl. .................. 428/690; 428/917; 313/504; 313/506; 257/40; 546/1; 546/268.1; 546/268.7; 546/269.1; 544/212; 544/256; 544/405; 548/440

(58) Field of Classification Search .................. 428/690, 428/917; 313/504, 506; 257/40, E51.049, 257/E51.05; 546/1, 268.1, 268.7, 269.1; 544/212, 256, 405; 548/440
See application file for complete search history.

(56) References Cited

U.S. PATENT DOCUMENTS 5,204,477 A * 4/1993 Reiffenrath et al. .......... 546/303
5,205,962 A * 4/1993 Coates et al. ........... 252/299.61

FOREIGN PATENT DOCUMENTS

DE          4218978       * 12/1993
JP          11329734        11/1999
WO   WO 2006/015828      *  2/2006

OTHER PUBLICATIONS

Machine-generated translation for DE 4218978 published Dec. 1993.*

(Continued)

*Primary Examiner*—Dawn Garrett
(74) *Attorney, Agent, or Firm*—H.C. Park & Associates, PLC

(57) ABSTRACT

A difluoropyridine-based compound includes at least one difluoropyridine group in its molecule. The difluoropyridine-based compound may be used as an electron injection material, an electron transport material, or a hole blocking material in full-color fluorescent or phosphorescent devices. The difluoropyridine-based compound has good electrical characteristics and a high charge transport capability. The difluoropyridine-based compound may be used to produce an organic electroluminescent device with high efficiency, low voltage, improved brightness, and a long life expectancy.

15 Claims, 4 Drawing Sheets

OTHER PUBLICATIONS

Frohn et al, Zeitschrift fuer Naturforschung, B: Chemical Sciences, (1995), 50(12), 1799-1810.*

Barlow et al., Journal of the Chem. Soc., Perkins Transactions 1: Organic and Bio-Organic Chemistry (1972-1999), (1980), (11), pp. 2520-2522.*

Barlow et al., Journal of the Chem. Soc. Chemical Communications, (1979), (14), pp. 608-609.*

Reiffenrath et al., Angewandte Chemie, 106(13), (1994), pp. 1435-1438.*

Oldham et al., Journal of the Chemical Society [Section] B: Physical Organic (1970), (7), pp. 1346-1349.*

C. W. Tang, et al., Organic Electroluminescent Diodes, Appl. Phys. Lett, 51 (12), 1987, pp. 913-915.

Yoshiyuki Kuwabara et al; Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials; Advanced Materials; 1994, pp. 677-679.

* cited by examiner

DIFLUOROPYRIDINE-BASED COMPOUND AND ORGANIC ELECTROLUMINESCENT DEVICE USING THE SAME

BACKGROUND OF THE INVENTION

This application claims priority to and the benefit of Korean Patent Application No. 10-2005-0064057, filed on Jul. 15, 2005, which is hereby incorporated by reference for all purposes as if fully set forth herein.

1. Field of the Invention

The present invention relates to an organic compound that includes at least one difluoropyridine group in its molecules. The organic compound may be used as an electron injection layer, an electron transport layer, a light-emitting layer, or a hole blocking layer of an organic electroluminescent device.

2. Discussion of the Background

Electroluminescent (EL) devices are self-emissive display devices with a number of advantages such as high visibility, a wide viewing angle, good contrast, and rapid response speed. The EL devices are classified as either inorganic EL devices that use an inorganic compound as the light-emitting layer material or organic EL devices that use an organic compound as the light-emitting layer material. Organic EL devices have superior brightness, driving voltage, and response speed compared to inorganic EL devices, and offer a polychromaticity effect. These advantages have encouraged a significant amount of research into organic EL devices.

One study by Kodak Co. ("Appl. Phys. Lett." 51, 913 (1987)) describes a functionally separated, double-layered organic EL device that includes ITO as an anode material, a Mg—Ag alloy as a cathode material, a tris(8-quinolinolate) aluminum complex ($Alq_3$) as an electron transport material and a light-emitting material, and a triphenylamine derivative as a hole transport material. The EL device has a luminance of about 1,000 $cd/m^2$ at an applied voltage of about 10V. The organic EL device exhibits luminance characteristics that are superior to a conventional single-layered organic EL devices due to its stacked structure of electron transport material and hole transport material.

Generally, the structure of an organic EL device is obtained by adding a hole injection/transport layer or an electron injection layer to a basic stack structure of anode/organic light-emitting layer/cathode. The resulting combinations include anode/hole injection layer/hole transport layer/organic light-emitting layer/cathode, anode/hole injection layer/hole transport layer/organic light-emitting layer/electron injection layer/cathode, and anode/hole injection layer/hole transport layer/organic light-emitting layer/electron transport layer/electron injection layer/cathode. Various organic compounds may be used in this stacked organic EL device as an electron injection layer or an electron transport layer, for example, $Alq_3$, oxadiazole, triazole, benzimidazole, benzoxazole, or benzothiazole. But none of these compounds are sufficiently bright or durable. $Alq_3$ is the best conventional compound known, due to its good stability and high electron affinity. However, the use of $Alq_3$ in a blue light emitting device lowers color purity due to emission by exciton diffusion. Furthermore, organic EL devices that use conventional organic compounds consume too much power and an organic compound that requires less power is needed to increase the life expectancy and efficiency of organic EL devices.

SUMMARY OF THE INVENTION

The present invention provides a difluoropyridine-based compound that may be used as an organic light-emitting layer, an electron injection layer, an electron transport layer, and a hole blocking layer between an anode and a cathode of an organic EL device. The molecules of the difluoropyridine-based compound include at least one difluoropyridine group. The difluoropyridine-based compound has good electrical stability, a high electron transport capability, and good durability. It can prevent crystallization and may be used in full-color fluorescent or phosphorescent devices.

The present invention also provides a method of preparing the difluoropyridine-based compound.

The present invention also provides an organic electroluminescent (EL) device that includes the difluoropyridine-based compound, and thus is very bright, has low voltage, and has a long life expectancy.

Additional features of the invention will be set forth in the description which follows, and in part will be apparent from the description, or may be learned by practice of the invention.

The present invention discloses a difluoropyridine-based compound represented by Formula 1:

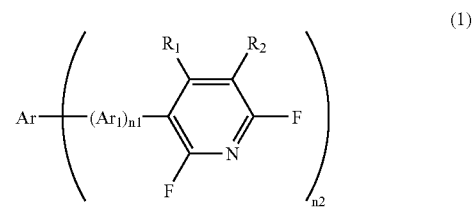

where Ar and $Ar_1$ are each selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

$R_1$ and $R_2$ are connected to form a ring or are each selected from the group of a hydrogen atom, halogen, a cyano group, a formyl group, a substituted alkyl group of 1-30 carbon atoms, an unsubstituted alkyl group of 1-30 carbon atoms, a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

n1 is an integer of 0 to 3; and n2 is an integer of 1 to 6.

The present invention also discloses a method of preparing a difluoropyridine-based compound represented by Formula 1 below, that includes reacting a compound represented by Formula 1A below with a compound represented by Formula 1B or Formula 1C below:

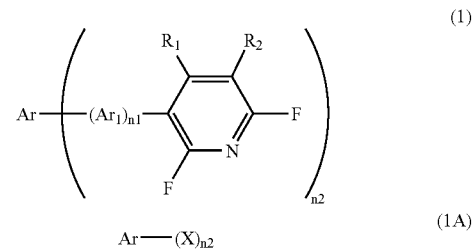

-continued

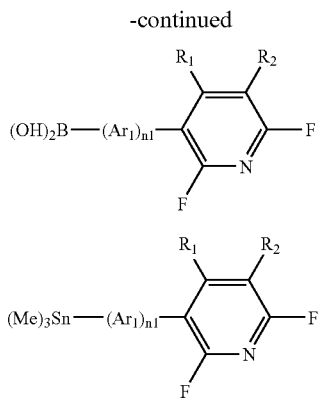

where Ar and Ar₁ are each selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

X is a halogen compound;

$R_1$ and $R_2$ are connected to form a ring or are each selected from the group of a hydrogen atom, halogen, a cyano group, a formyl group, a substituted alkyl group of 1-30 carbon atoms, an unsubstituted alkyl group of 1-30 carbon atoms, a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

n1 is an integer of 0 to 3; and n2 is an integer of 1 to 6.

The present invention also discloses an organic electroluminescent (EL) device that includes an organic layer between a pair of electrodes, where the organic layer includes a difluoropyridine-based compound represented by Formula 1:

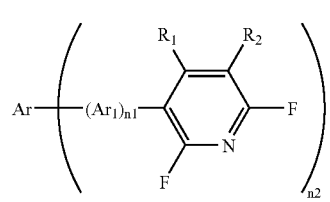

where Ar and Ar₁ are each selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

$R_1$ and $R_2$ are connected to form a ring or are each selected from the group of a hydrogen atom, halogen, a cyano group, a formyl group, a substituted alkyl group of 1-30 carbon atoms, an unsubstituted alkyl group of 1-30 carbon atoms, a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

n1 is an integer of 0 to 3; and n2 is an integer of 1 to 6.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
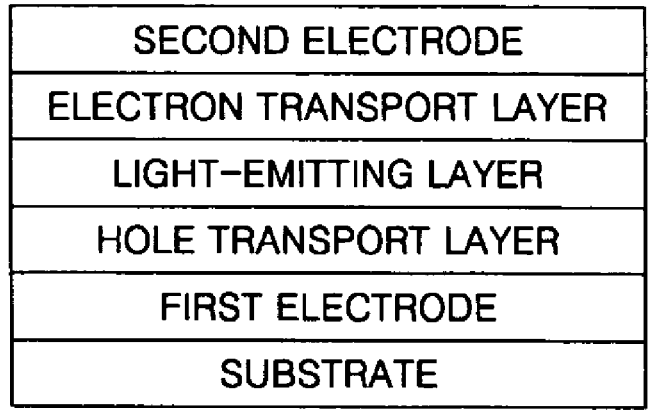
FIG. 1A, FIG. 1B, and FIG. 1C show the structures of organic electrolumenescent (EL) devices according to exemplary embodiments of the present invention.

The present invention relates to an organic compound that includes at least one difluoropyridine derivative on its molecules as a side chain. Compounds according to the present invention have better electrical characteristics and higher electron transport capability, and thus can be effectively used as an electron injection material, an electron transport material, and/or a hole blocking material in full-color fluorescent or phosphorescent devices. The compounds of the present invention can be used to produce organic EL devices with high efficiency, low voltage, improved brightness, and long life expectancy.

The organic compound may be used as an electron transport material of a green fluorescent device. An organic EL device using the organic compound in its electron transport layer will use less voltage and be brighter than a conventional organic EL device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

The present invention provides a difluoropyridine-based compound represented by Formula 1 below:

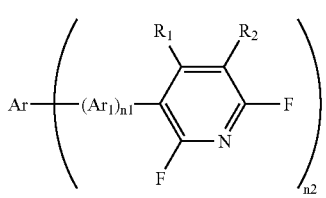

(1)

wherein Ar and Ar$_1$ are each independently a substituted or unsubstituted aryl group of 6-30 carbon atoms or a substituted or unsubstituted heterocyclic compound of 4-30 carbon atoms;

R$_1$ and R$_2$ may be connected to form a ring or are each selected from the group of a hydrogen atom, halogen, a cyano group, a formyl group, a substituted or unsubstituted alkyl group of 1-30 carbon atoms such as a methyl group, an ethyl group, a butyl group, a t-butyl group, and a cyclohexyl group, a substituted or unsubstituted aryl group of 6-30 carbon atoms, and a substituted or unsubstituted heterocyclic compound of 4-30 carbon atoms;

n1 is an integer from 0 to 3; and n2 is an integer from 1 to 6.

The aryl group includes molecular groups that have one hydrogen atom removed from an aromatic hydrocarbon. The aryl group is a monovalent substituent and is the term corresponding to an aliphatic alkyl group. Examples of the aryl group include a phenyl group derived from benzene, an anthryl group derived from anthracene, and a phenanthryl group derived from phenanthrene. A compound obtained by the direct coupling of two benzene nuclei is called "biphenyl". The aryl group also encompasses substituted benzene rings.

The heterocyclic compound includes hetero atom-containing cyclic organic compounds that include carbon and at least one ring member selected from the group of oxygen, sulfur, nitrogen, phosphorus, arsenic, and the like. The heterocyclic compound includes hetero atom-containing five- or six-membered aromatic cyclic compounds and their derivatives, two or more hetero atom-containing aromatic compounds, heterocyclic compounds obtained by condensation between a hetero ring and a benzene ring or between hetero rings, and simple hetero atom-containing cyclic compounds.

According to an exemplary embodiment of the present invention, the substituted or unsubstituted aryl group of 6-30 carbon atoms may be a substituted or unsubstituted aryl group of 6-15 carbon atoms, such as a phenyl group, a methylphenyl group, a trimethylphenyl group, an ethylphenyl group, an ethylbiphenyl group, o-, m- and p-fluorophenyl groups, a dichlorophenyl group, a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a methylnaphthyl group, an anthracenyl group, an azulenyl group, a heptalenyl group, an acenaphthylenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a lower alkyl carbazolyl group, a biphenyl group, a lower alkyl biphenyl group, a lower alkoxy biphenyl group, a thiophenyl group, an indolyl group, and a pyridyl group. The lower alkyl and the lower alkoxy have 1-5 carbon atoms.

According to an exemplary embodiment of the present invention, the substituted or unsubstituted aryl group of 6-30 carbon atoms may be a substituted or unsubstituted aryl group of 6-15 carbon atoms, such as a monocyclic, bicyclic, or tricyclic aryl group such as a fluorenyl group, a carbazolyl group, a phenyl group, a naphthyl group, and a phenanthryl group, or an aryl group whose aromatic ring is substituted by one, two, or three of the groups selected from lower alkyl of 1-3 carbon atoms, lower alkoxy of 1-3 carbon atoms, cyano, phenoxy, phenyl, and halogen.

According to an exemplary embodiment of the present invention, the substituted or unsubstituted heterocyclic compound of 4-30 carbon atoms may be a substituted or unsubstituted heterocyclic compound of 2-15 carbon atoms such as a five- or six-membered cyclic compound. The hetero atom may be a nitrogen atom, an oxygen atom, or a sulfur atom.

Other examples of the heterocyclic compound include nitrogen-containing five-membered heterocyclic compounds with two or more hetero atoms such as pyrazole, imidazole, oxazole, thiazole, 1,2,3- or 1,2,4-triazole, tetrazole, 1,2,4-, 1,2,5- or 1,3,4-oxadiazole, and nitrogen-containing six-membered heterocyclic compounds such as pyridine, pyridazine, pyrimidine, and triazine.

According to an exemplary embodiment of the present invention, the difluoropyridine-based compound may have two ortho fluorines with high electron affinity acting as electron withdrawing groups with respect to a nitrogen atom in the pyridine ring. The difluoropyridine-based compound thus exhibits a high electron transport capability. Therefore, when the difluoropyridine-based compounds are used in an organic EL device as an electron injection/transport material, an electron emitting material, a host material of a light-emitting layer, or a hole blocking layer material, the organic EL device can be driven at low voltage due to good electron transport capability and is very bright and has a long life expectancy. Difluoropyridine-based compounds that have molecules that include two or more 2,6-difluoropyridine groups with good electron transport capability have even more desirable characteristics.

Difluoropyridine-based compounds represented by Formula 1 can be used as an electron injection material, an electron transport material, a hole blocking layer material, and a hole transport layer material. Representative structures of the difluoropyridine-based compound of the present invention will now be described, but the present invention is not limited thereto.

The compound of Formula 1 encompasses the compounds represented by Formulae 2-13 below:

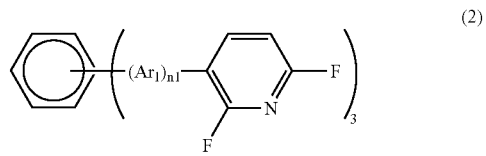

(2)

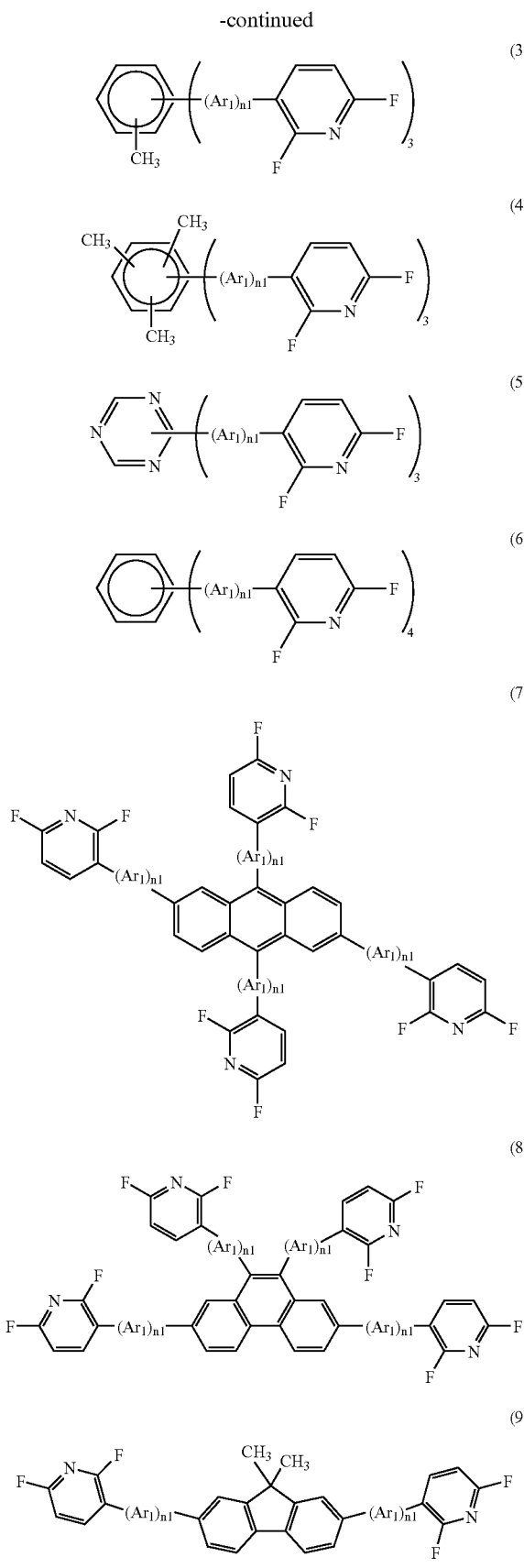
where n1 is an integer of 0 to 3, and $Ar_1$ is a substituted or unsubstituted aryl group of 6-30 carbon atoms or a substituted or unsubstituted heterocyclic compound of 4-30 carbon atoms. In an exemplary embodiment of the present invention, $Ar_1$ may be selected from:

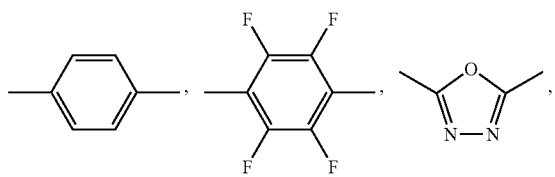 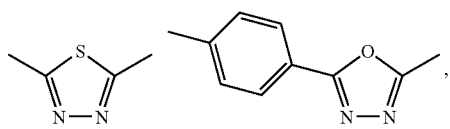 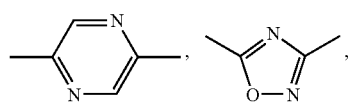
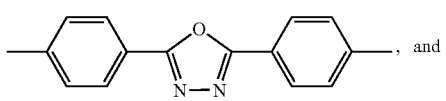
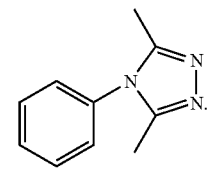
Examples of the difluoropyridine-based compound of the present invention include compounds represented by the following non-limiting structural formulae 14 through 29:
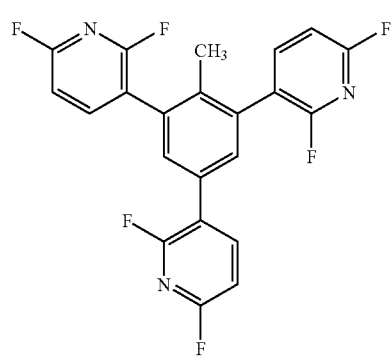
(14)
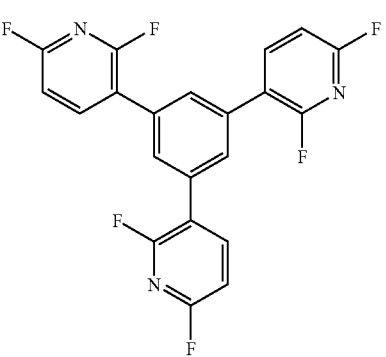
(15)
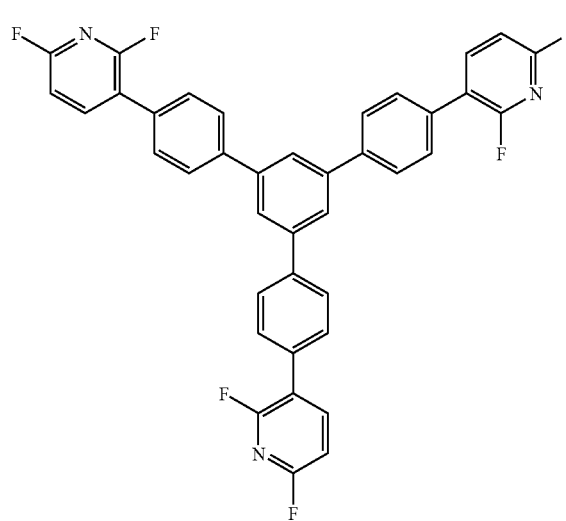
(16)
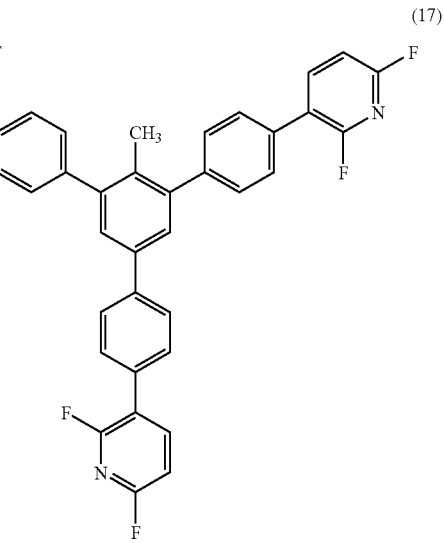
(17)

-continued
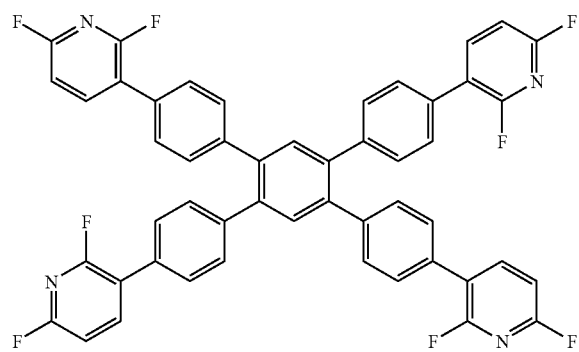 (18)
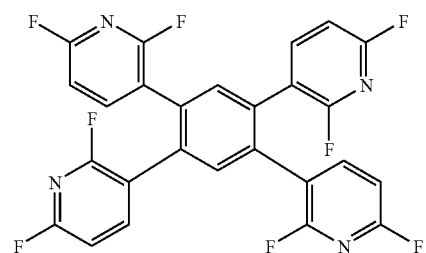 (19)
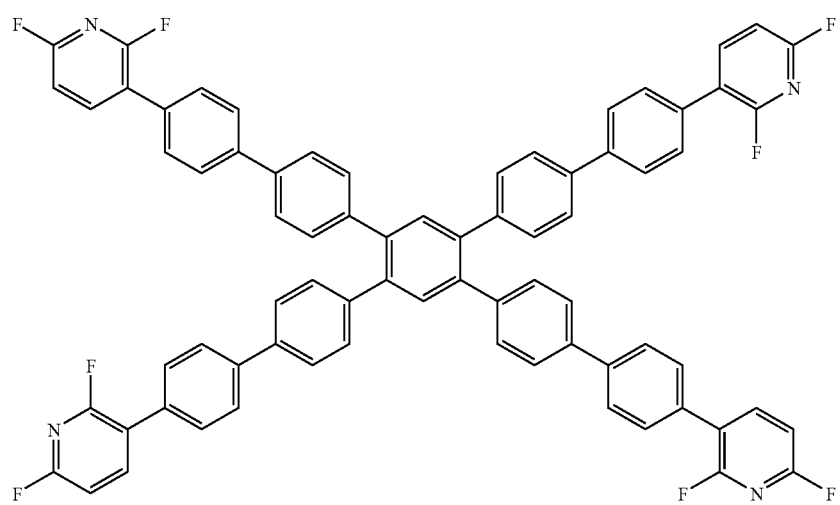 (20)
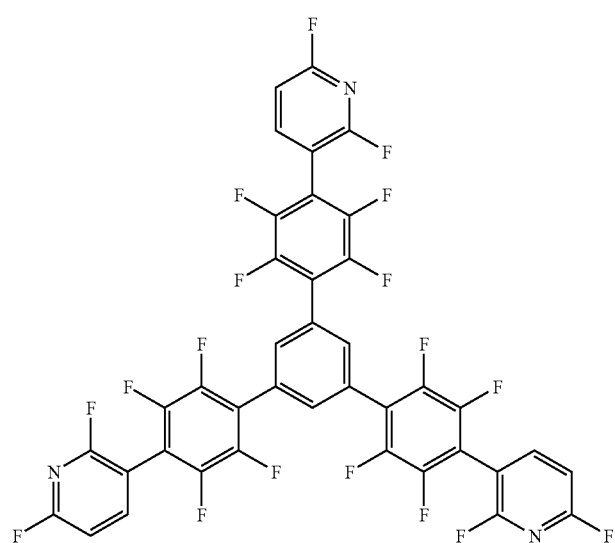 (21)

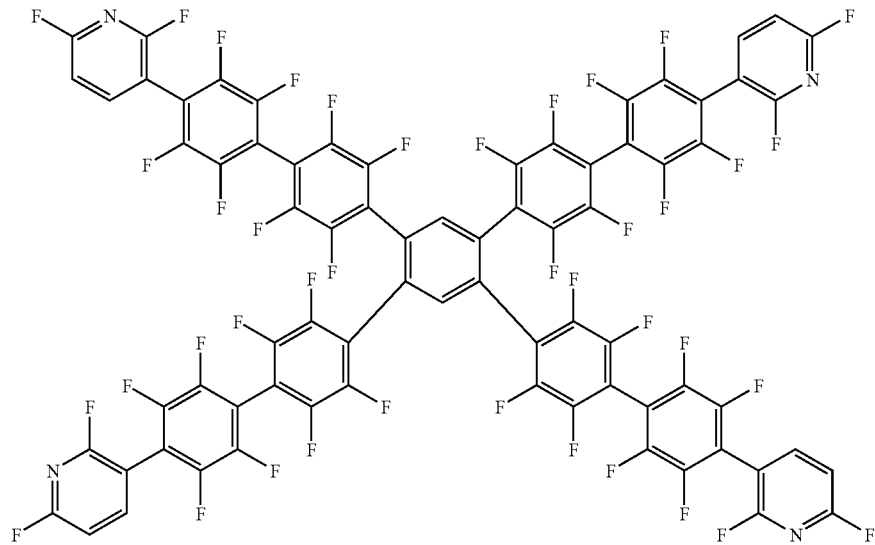
(22)
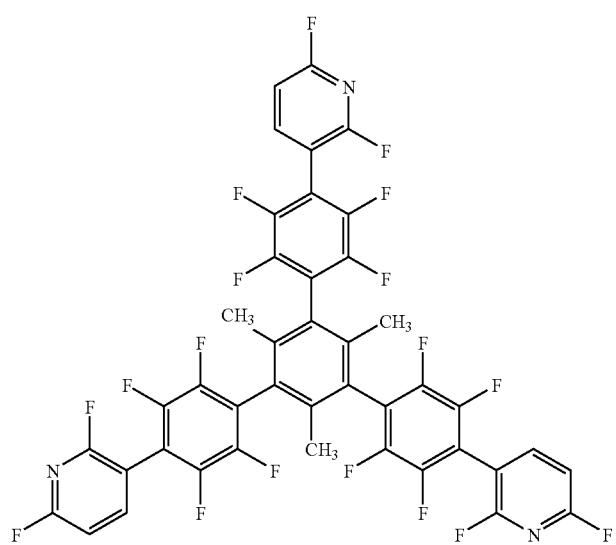
(23)

-continued
(24)
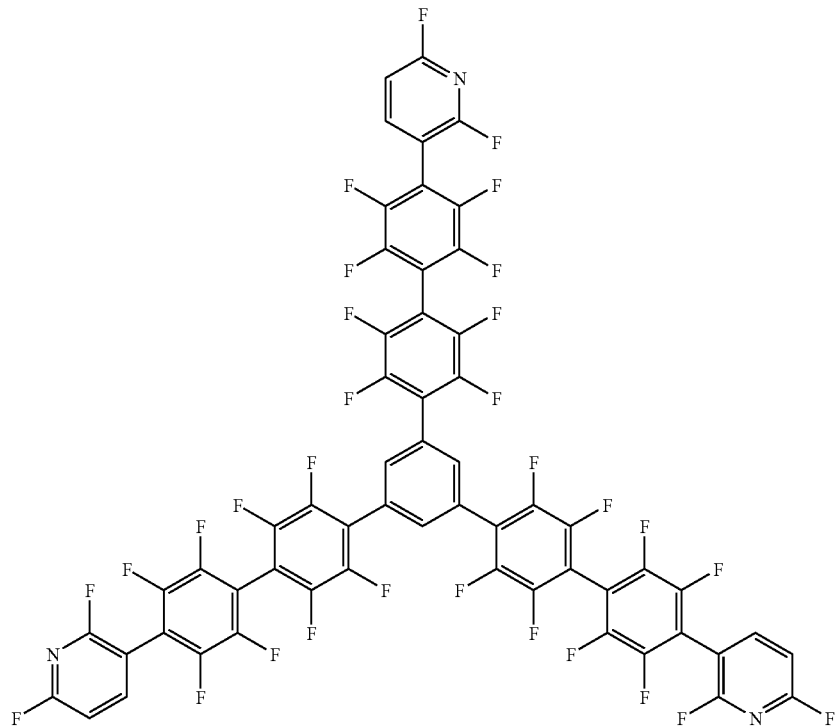
(25)
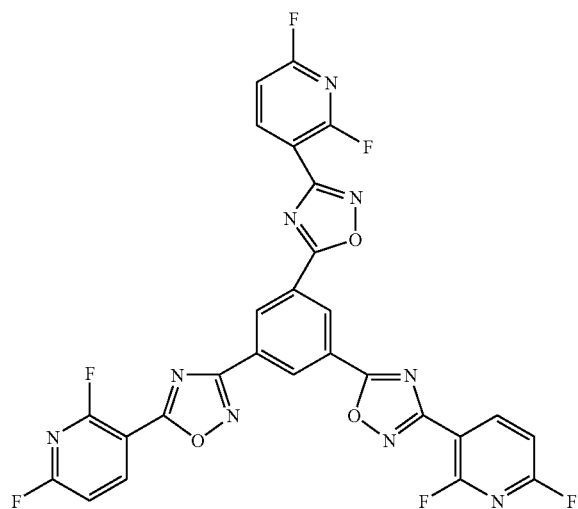

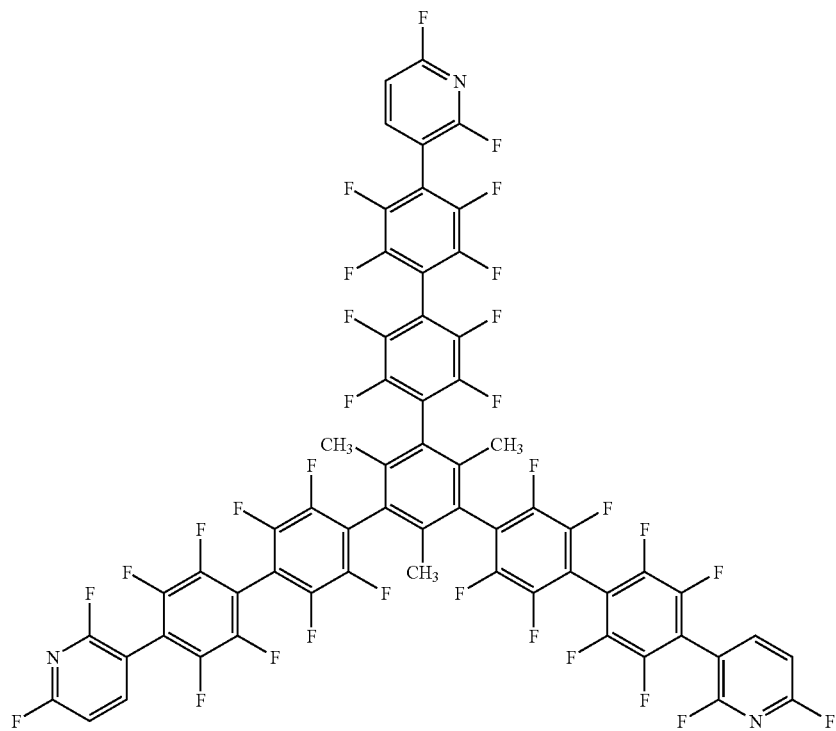
(26)
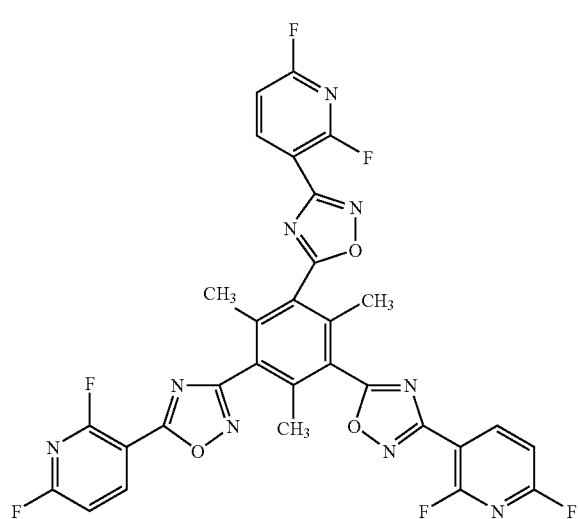
(27)

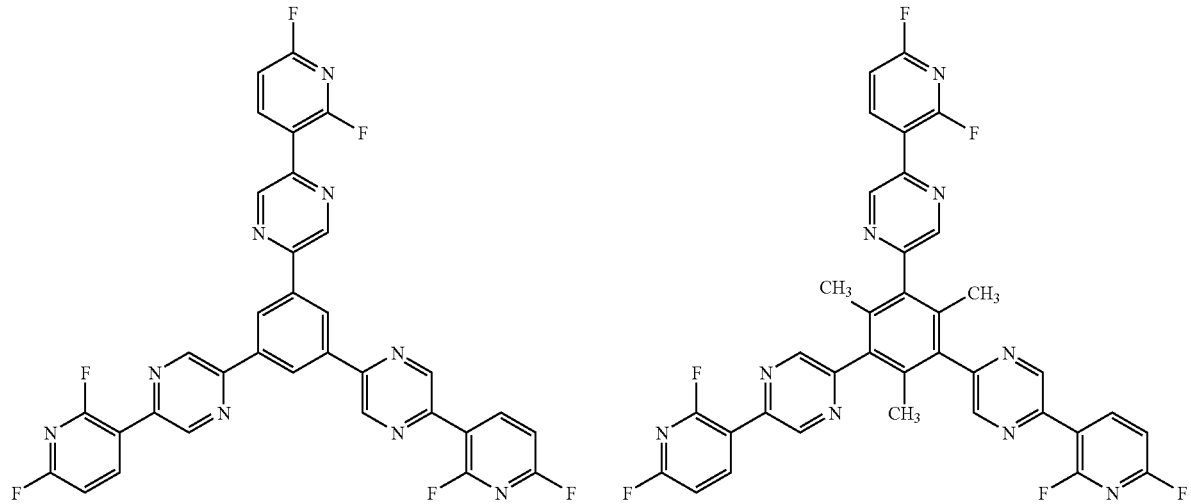

The present invention also provides a method of preparing a difluoropyridine-based compound represented by Formula 1 below, which includes reacting a compound represented by Formula 1A below with a compound represented by Formula 1B or Formula 1C below:

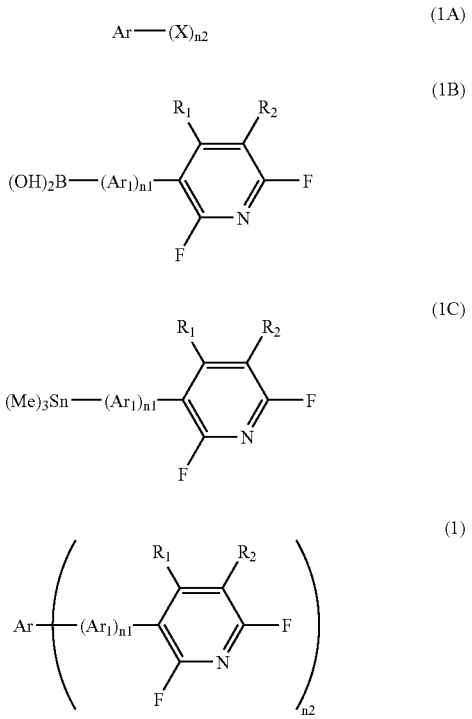

where Ar and Ar₁ are each a substituted or unsubstituted aryl group of 6-30 carbon atoms, or a substituted or unsubstituted heterocyclic compound of 4-30 carbon atoms. In an exemplary embodiment of the present invention Ar and Ar₁ may be selected from the group of pyrazole, imidazole, oxazole, thiazole, 1,2,3-triazole, 1,2,4-triazole, tetrazole, oxadiazole, pyridine, pyridazine, pyrimidine, triazine, and a derivative thereof.

X is a halogen compound. In an exemplary embodiment of the present invention, X is Br or Cl.

$R_1$ and $R_2$ are connected to form a ring or are each selected from a hydrogen atom, a halogen, a cyano group, a formyl group, a substituted or unsubstituted alkyl group of 1-30 carbon atoms, a substituted or unsubstituted aryl group of 6-30 carbon atoms, and a substituted or unsubstituted heterocyclic compound of 4-30 carbon atoms. In an exemplary embodiment of the present invention, $R_1$ and $R_2$ are each selected from a hydrogen or a is substituted or unsubstituted alkyl group of 1-15 carbon atoms.

n1 is an integer from 0 to 3. In an exemplary embodiment of the present invention, n1 is an integer from 0 to 2.

n2 is an integer from 1 to 6. In an exemplary embodiment of the present invention, n2 is 3 or 4.

A method of manufacturing an organic EL device according to the present invention will now be described.

Figure 1B:
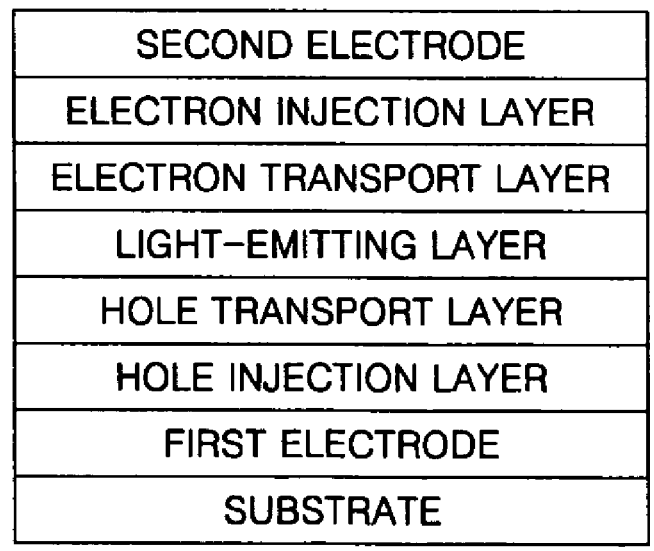
Figure 1C:
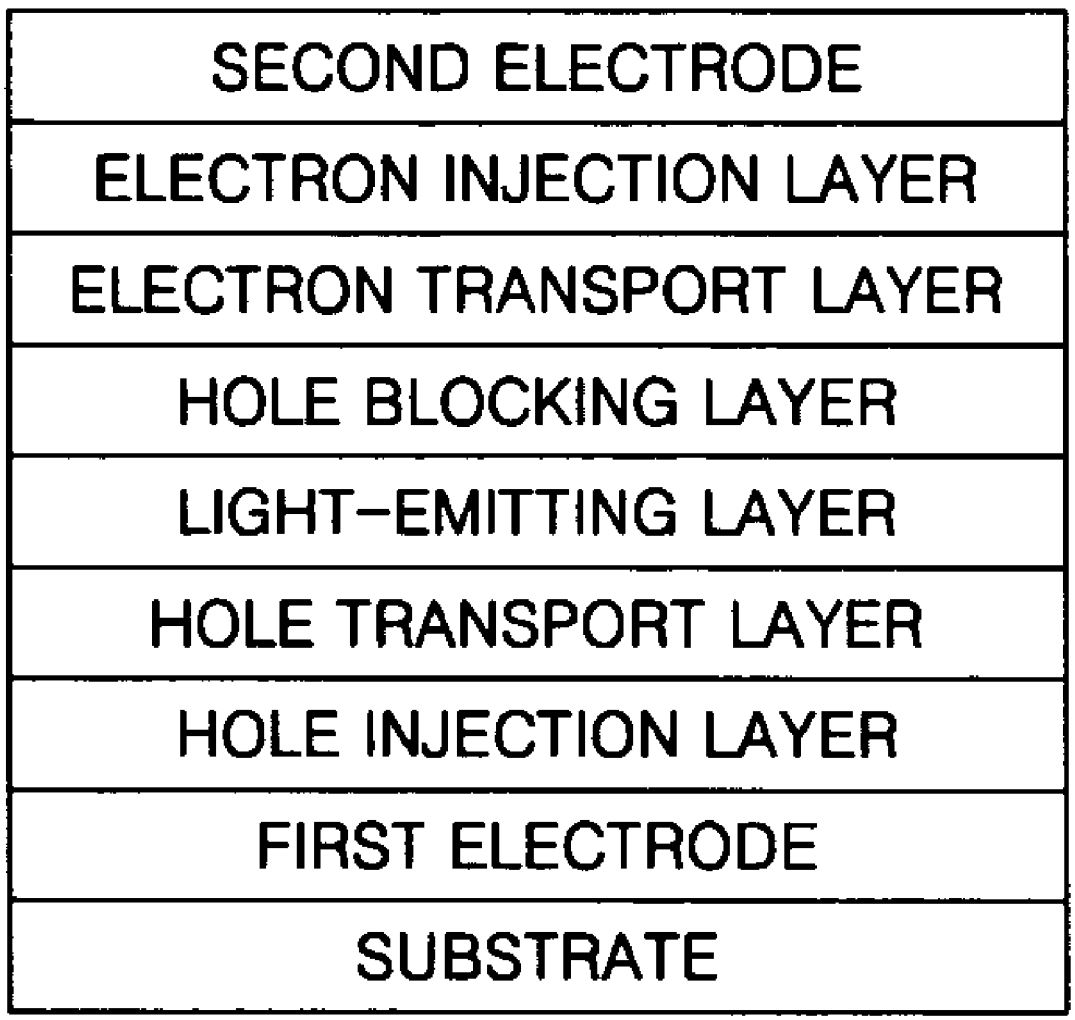

FIG. 1A, FIG. 1B, and FIG. 1C show the structures of organic EL devices according to the present invention.

First, an anode material with a high work function is deposited or sputtered on a substrate to form an anode. The substrate may be a substrate used in conventional organic EL devices. The substrate may be made of glass or transparent plastic and should have excellent mechanical strength, thermal stability, transparency, surface smoothness, handling properties, and water resistance. The anode material may be a material with good transparency and conductivity such as indium tin oxide (ITO), indium zinc oxide (IZO), tin oxide ($SnO_2$), or zinc oxide (ZnO).

Next, a hole injection layer (HIL) may be formed on the anode using vacuum deposition, spin coating, casting, or LB method. Vacuum deposition is advantageous because it results in uniform film formation and generates fewer pinholes. The deposition conditions during the vacuum deposition process vary according to the compound used to form the HIL, the desired structure of the HIL, and thermal characteristics. A deposition temperature of about 50° C. to about 500° C., a vacuum of about $10^{-8}$ torr to about $10^{-3}$ torr, and a deposition rate of about 0.01 Å/sec to about 100 Å/sec may be used. The HIL may be about 10 Å to about 5 µm thick. The HIL material is not particularly limited and may be, for example, a phthalocyanine compound such as copper phthalocyanine disclosed in U.S. Pat. No. 4,356,429 or starburst amine derivatives such as TCTA, m-MTDATA, and m-MTDAPB disclosed in Advanced Material, 6, p. 677 (1994).

Next, a hole transport layer (HTL) may be formed on the HIL using vacuum deposition, spin coating, casting, or LB method. Vacuum deposition is advantageous because it results in uniform film formation and generates fewer pinholes. The deposition conditions during vacuum deposition may vary according to the compound used, but are generally the same as the deposition conditions used when forming the HIL. The HTL material is not particularly limited and may be selected from commonly known HTL materials, such as a carbazole derivative such as N-phenylcarbazole or polyvinylcarbazole, an aromatic condensation ring-containing common amine derivative such as N,N'-bis(3-methylphenyl)-N,N'-diphenyl-[1,1-biphenyl]-4,4'-diamine (TPD), or N,N'-di(naphthalene-1-yl)-N,N'-diphenylbenzidine (α-NPD), or the like.

Next, a light-emitting layer (EML) may be formed on the HTL using vacuum deposition, spin coating, casting, or LB method. Vacuum deposition is advantageous because it results in uniform film formation and generates fewer pinholes. The deposition conditions during vacuum deposition may vary according to the compound used, but are generally the same as the deposition conditions used when forming the HIL. The EML material is not particularly limited. Tris(8-quinolinolate)aluminum ($Alq_3$) or the like may be used as a fluorescent host. The fluorescent dopant may be IDE102 or IDE105, which are commercially available from Idemitsu, or C545T, which is commercially available from Hayashibara Biochemical Laboratories, Inc. The green phosphorescent dopant may be $Ir(ppy)_3$. The blue phosphorescent dopant may be $F_2Irpic$. The red phosphorescent dopant may be RD 61, UDC. The dopants may be co-deposited. The doping concentration is not particularly limited and may be present in an amount of about 0.01 to about 15 wt % based on the host.

A hole blocking layer (HBL) may be formed on the EML. An HBL is especially advantageous when a phosphorescent dopant is used as the light-emitting layer because the HBL prevents the diffusion of triplet excitons or holes toward an electron transport layer. The HBL may be formed by vacuum deposition or spin coating. The HBL material is not particularly limited, and may be the difluoropyridine-based compound of Formula 1 or may be a commonly known hole blocking material such as an oxadiazole derivative, a triazole derivative, a phenanthroline derivative, the hole blocking material disclosed in Japanese Patent Laid-Open Publication No. Hei. 11-329734, Balq, BCP, or the like Next, an electron transport layer (ETL) is formed by vacuum deposition, spin coating, casting, or the like. Vacuum deposition is advantageous. The ETL material is not particularly limited provided that it can stably transport electrons from an electron source electrode (cathode). The electron transport layer material may be the difluoropyridine-based compound of Formula 1 or a quinoline derivative such as $Alq_3$.

An electron injection layer (EIL) may be formed on the electron transport layer to facilitate the injection of electrons from a cathode. The EIL material is not particularly limited and may be LiF, NaCl, CsF, $Li_2O$, or BaO. The deposition conditions during vacuum deposition of the HBL, the ETL, and the EIL may vary according to the compound used, but are generally the same as the deposition conditions used when forming the HIL.

Finally, a cathode metal is vacuum deposited or sputtered on the electron injection layer to form a cathode. The cathode metal may be a metal with a low work function, its alloy, an electroconductive compound, or a mixture thereof. Examples of the cathode metal include lithium (Li), magnesium (Mg), aluminum (Al), aluminum-lithium (Al—Li), calcium (Ca), magnesium-indium (Mg—In), and magnesium-silver (Mg—Ag). The cathode may be made of a transparent material such as ITO or IZO to obtain a front emission type device.

An organic EL device of the present invention may have various structures that differ from the structures shown in FIG. 1A, FIG. 1B and FIG. 1C. For example, one, two, or more interlayers may be further formed.

The present invention will now be described more specifically with reference to Synthesis Example 1, Synthesis Example 2, and Synthesis Example 14. The following Examples are for illustrative purposes and are not intended to limit the scope of the invention.

SYNTHESIS EXAMPLE 1

Compound 1

Compound 1 was synthesized by Reaction Scheme 1 below:

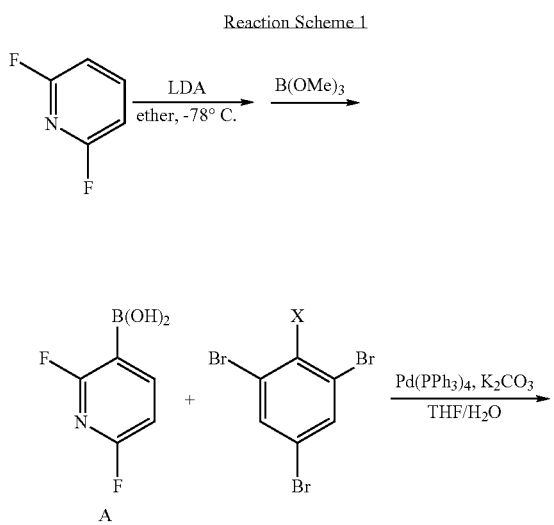

-continued

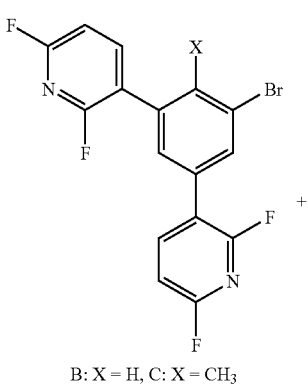

B: X = H, C: X = CH$_3$

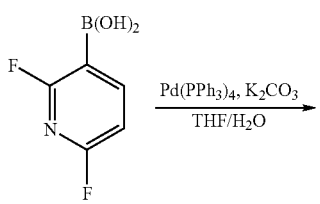

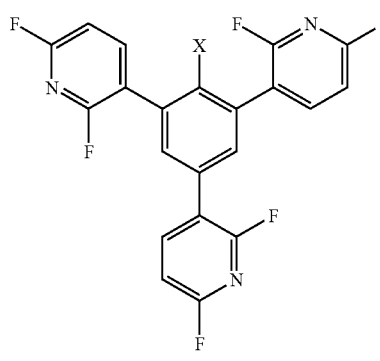

1: X = H, 14: X = CH$_3$

Synthesis of Intermediate Compound A 6.0 mL (12.0 mmol) of LDA (lithium diisopropylamide) was added to 50 mL of diethylether. 0.91 mL (10.0 mmol) of difluoropyridine was added dropwise at −78° C. and the reaction mixture was stirred for one hour. 1.4 mL (12.5 mmol) of trimethylborate was added and the resultant mixture was stirred at room temperature for one hour. 20 mL of a 5% sodium hydroxide solution was added and an aqueous layer was neutralized with a 3N HCl solution. The aqueous layer was extracted three times with 20 ml ethylacetate used each time. The collected organic layer was dried over magnesium sulfate to evaporate the solvent. The obtained residue was dried under vacuum to produce Intermediate Compound A in the form of a white solid (1.03 g, yield: 65%).

Synthesis of Intermediate Compound B 1.18 g (7.43 mmol) of Intermediate Compound A and 0.787 g (2.5 mmol) of 1,3,5-tribromobenzne were dissolved in 18 mL of THF. 347 mg (0.3 mmol) of tetrakistriphenylphosphine palladium was added. Then an aqueous solution of 8.29 g (60 mmol) of potassium carbonate in 10 mL of distilled water was added and the reaction mixture was stirred at 75° C. for 12 hours. The reaction solution was extracted three times with 10 ml of ethylacetate used each time. The collected organic layer was dried over magnesium sulfate to evaporate the solvent. The obtained residue was purified by silica gel column chromatography to produce Intermediate Compound B in the form of a white solid (460 mg, yield: 48%). Intermediate Compound B was identified by $^1$H NMR. The results were: $^1$H NMR (CDCl$_3$, 400 MHz) δ(ppm) 8.01 (t, 2H), 7.72 (s, 2H), 7.61 (s, 1H), 6.98 (dd, 2H)

Synthesis of Intermediate C 0.953 g (6.0 mmol) of Intermediate Compound A and 0.658 g (2.0 mmol) of 2,4,6-tribromotoluene were dissolved in 15 mL of THF. 289 mg (0.25 mmol) of tetrakistriphenylphosphine palladium was added. Then an aqueous solution of 6.91 g (50 mmol) of potassium carbonate in 10 mL of distilled water was added and the reaction mixture was stirred at 75° C. for 12 hours. The reaction solution was extracted three times with 10 ml of ethylacetate used each time. The collected organic layer was dried over magnesium sulfate to evaporate the solvent. The obtained residue was purified by silica gel column chromatography to produce Intermediate Compound C in the form of a white solid (315 mg, yield: 40%). Intermediate Compound C was identified by $^1$H NMR. The results were: 1H NMR (CDCl$_3$, 400 MHz) δ(ppm) 7.97 (t, 1H), 7.86-7.80 (m, 2H), 7.32 (s, 1H), 6.98-6.91 (m, 2H), 2.31 (s, 3H)

Synthesis of Compound 1

0.855 g (5.38 mmol) of Intermediate Compound A and 1.031 g (2.69 mmol) of Intermediate Compound B were dissolved in 15 mL of THF. 156 mg (0.135 mmol) of tetrakistriphenylphosphine palladium was added. An aqueous solution of 3.72 g (26.9 mmol) of potassium carbonate in 10 mL of distilled water was added. The reaction mixture was stirred at 75° C. for 12 hours. The reaction solution was extracted three times with 10 ml of ethylacetate used each time. The collected organic layer was dried over magnesium sulfate to evaporate the solvent. The obtained residue was purified by silica gel column chromatography to produce Compound 1 in the form of a white solid (628 mg, yield 56%). Compound 1 was identified by 1H NMR. The results were: 1H NMR (CDCl$_3$, 400 MHz) δ(ppm) 8.06 (t, 3H), 7.72 (s, 3H), 7.00 (dd, 3H)

Synthesis of Compound 14

0.213 g (1.34 mmol) of Intermediate Compound A and 0.264 g (0.67 mmol) of Intermediate Compound C were dissolved in 5 mL of THF. 39.3 mg (0.034 mmol) of tetrakistriphenylphosphine palladium was added. An aqueous solution of 0.912 g (6.6 mmol) of potassium carbonate in 3 mL of distilled water was added. The reaction mixture was stirred at 75° C. for 12 hours. The reaction solution was extracted three times with 10 ml of ethylacetate used each time. The collected organic layer was dried over magnesium sulfate to evaporate the solvent. The obtained residue was purified by silica gel column chromatography to produce Compound 14 in the form of a white solid (133 mg, yield 46%). Compound 14 was identified by 1H NMR. The results were: 1H NMR (CDCl$_3$, 400 MHz) δ(ppm) 7.91 (t, 2H), 7.46 (s, 2H), 6.99 (dd, 2H), 6.95 (dd, 2H), 2.05 (s, 3H)

SYNTHESIS EXAMPLE 2

Compound 2

Compound 2 was synthesized by Reaction Scheme 2 below:

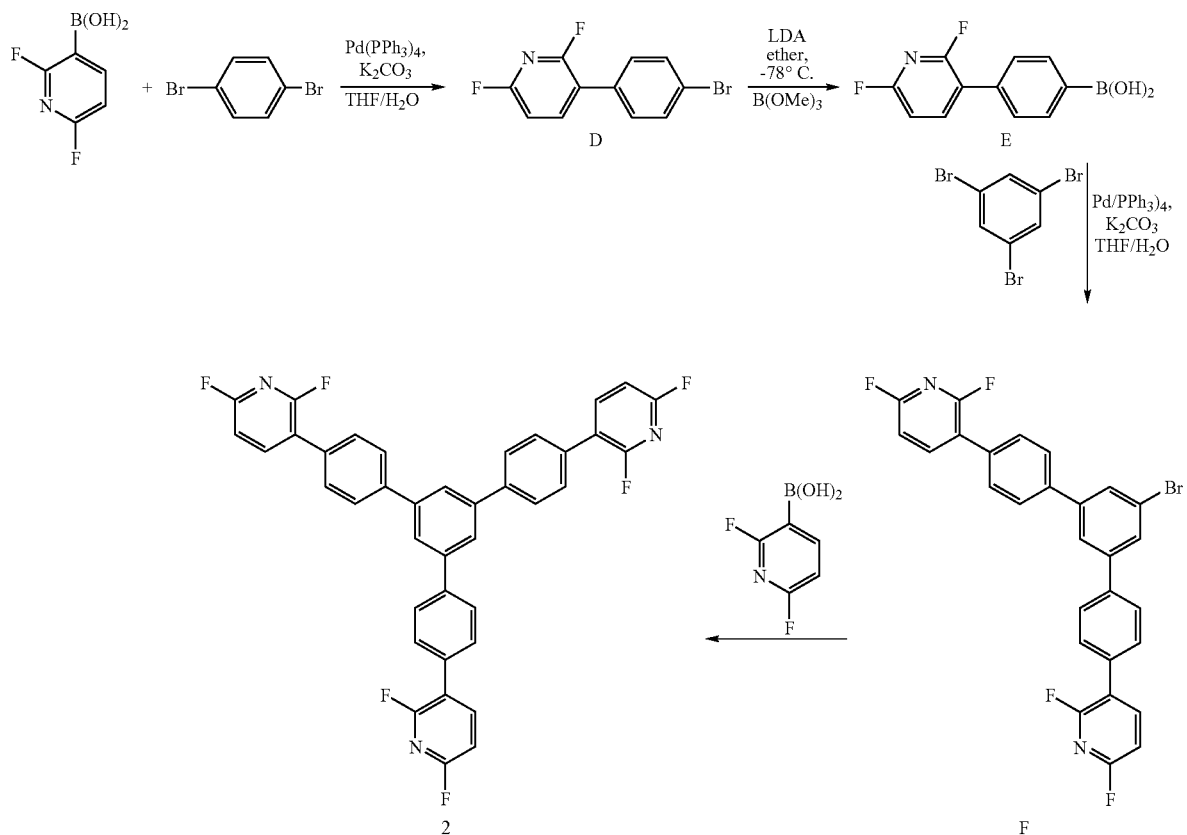

Reaction Scheme 2

Synthesis of Intermediate Compound D 0.477 g (3.0 mmol) of Intermediate Compound A and 1.06 g (4.5 mmol) of 1,4-dibromobenzene were dissolved in 10 mL of THF. 173 mg (0.15 mmol) of tetrakistriphenylphosphine palladium was added. An aqueous solution of 4.15 g (30 mmol) of is potassium carbonate in 7 mL of distilled water was added. The reaction mixture was stirred at 75° C. for 12 hours. The reaction solution was extracted three times with 10 ml of ethylacetate used each time. The collected organic layer was dried over magnesium sulfate to evaporate the solvent. The obtained residue was purified by silica gel column chromatography to produce Intermediate Compound D in the form of a white solid (510 mg, yield 63%). Intermediate Compound D was identified by 1H NMR. The results were: 1H NMR (CDCl$_3$, 400 MHz) δ(ppm) 7.95 (t, 1H), 7.61 (d, 2H), 7.39 (dd, 2H), 6.94 (dd, 1H)

Synthesis of Intermediate Compound E 1.983 g (7.34 mmol) of Intermediate Compound D was added to 50 mL of diethylether. 3.9 mL (9.55 mmol) of n-BuLi (2.5M in hexane) was added dropwise at −78° C. and the reaction mixture was stirred for one hour. 2.5 mL (22.0 mmol) of trimethylborate was added, and the reaction solution was stirred at room temperature for one hour and hydrolyzed with a 2N HCl solution. The reaction solution was extracted three times with 10 ml of ethylacetate used each time. The collected organic layer was dried over magnesium sulfate to evaporate the solvent. The obtained residue was dried under vacuum to produce Intermediate Compound E in the form of a white solid (0.932 g, yield 54%).

Synthesis of Intermediate Compound F 1.75 g (7.43 mmol) of Intermediate Compound E and 0.787 g (2.5 mmol) of 1,3,5-tribromobenzene were dissolved in 18 mL of THF. 347 mg (0.3 mmol) of tetrakistriphenylphosphine palladium was added. An aqueous solution of 8.29 g (60 mmol) of potassium carbonate in 10 mL of distilled water was added. The reaction mixture was stirred at 75° C. for 12 hours. The reaction solution was extracted three times with 10 ml of ethylacetate used each time. The collected organic layer was dried over magnesium sulfate to evaporate the solvent. The obtained residue was purified by silica gel column chromatography to produce Intermediate Compound F in the form of a white solid (538 mg, yield 35%). Intermediate Compound F was identified by 1H NMR. The results were: 1H NMR (CDCl$_3$, 400 MHz) δ(ppm) 8.13 (t, 2H), 7.82 (s, 2H), 7.60 (s, 1H), 7.58 (d, 2H), 7.52-7.44 (m, 6H), 6.95 (dd, 2H)

Synthesis of Compound 2

0.513 g (3.23 mmol) of Intermediate Compound A and 0.993 g (1.61 mmol) of Intermediate Compound F were dissolved in 10 mL of THF. 125 mg (0.108 mmol) of tetrakistriphenylphosphine palladium was added. An aqueous solution of 2.23 g (16.1 mmol) of potassium carbonate in 8 mL of distilled water was added. The reaction mixture was stirred at 75° C. for 12 hours. The reaction solution was extracted three times with 10 ml of ethylacetate used each time. The collected organic layer was dried over magnesium sulfate to evaporate the solvent. The obtained residue was purified by silica gel column chromatography to produce Compound 2 in the form of a white solid (490 mg, yield 47%). Compound 2 was identified by 1H NMR. The results were: 1H NMR (CDCl$_3$, 400 MHz) δ(ppm) 8.15 (t, 3H), 7.83 (s, 3H), 7.60 (d, 3H), 7.55-7.45 (m, 9H), 6.98 (dd, 3H)

EXAMPLE 1

A CORNING 15 Ω/cm$^2$ (1,200 Å) ITO glass substrate was cut into pieces 50 mm×50 mm×0.7 mm in size. The substrate was ultrasonically cleaned in isopropyl alcohol for 5 minutes, then ultrasonically cleaned in deionized water for 5 minutes, and then cleaned with UV and ozone for 30 minutes, to be used as an anode. The glass substrate was then disposed in a vacuum deposition apparatus. A 600 Å thick HIL made of IDE 406 was vacuum deposited on the glass substrate. A 300 Å thick HTL made of 4,4'-bis[N-(1-naphthyl)-N-phenylamino]biphenyl (NPB) was vacuum deposited on the HIL. A green fluorescent host, Alq$_3$, and a green fluorescent dopant, C545T were co-deposited on the HTL in a weight ratio of 98 to 2 to form an EML that was 200 Å thick. A 300 Å thick ETL made of Compound 1 was formed on the EML. An LiF/Al electrode was formed on the electron transport layer by sequential vacuum deposition of the halogenated alkaline metal, LiF, to produce a 10 Å thick electron injection layer, and then Al to produce a 3,000 Å thick cathode. The completed organic EL device is shown in FIG. 1B.

Figure 2:
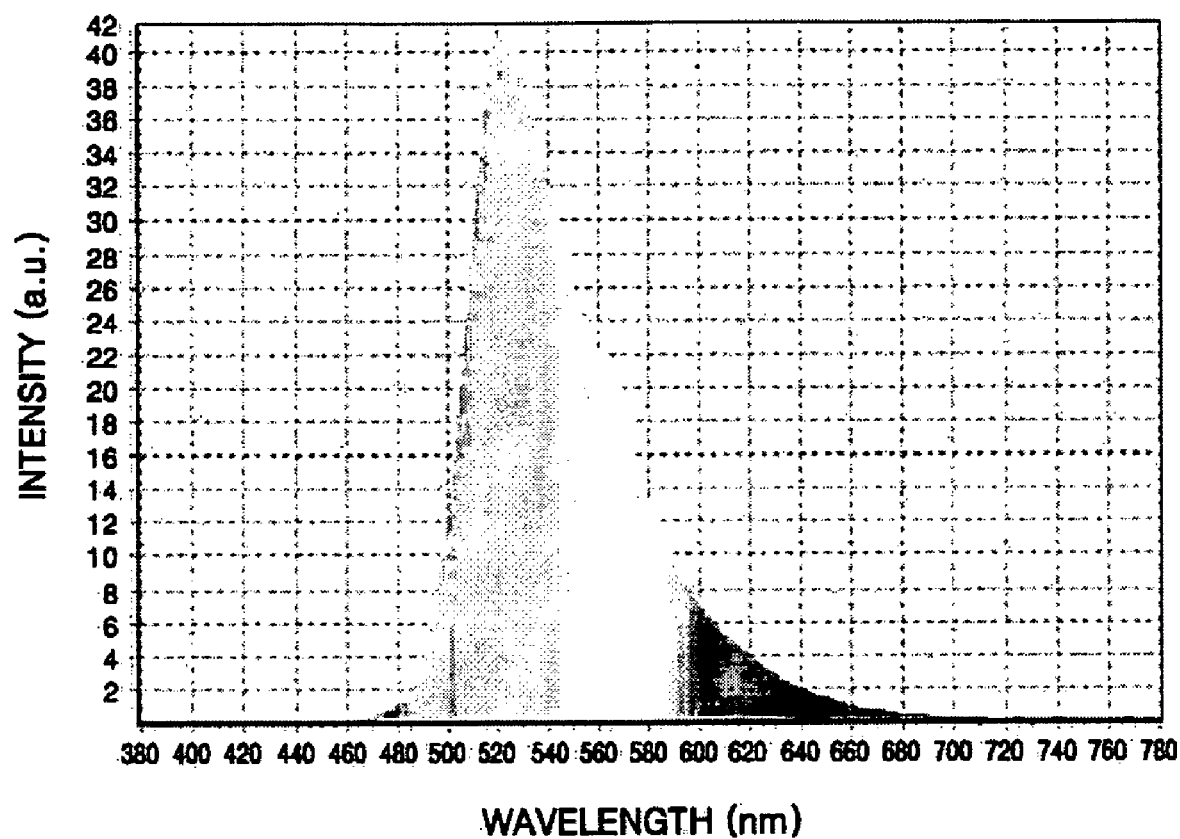
FIG. 2 shows an EL spectrum of an organic EL device according to Example 1 of the present invention.

The organic EL device of Example 1 exhibited a turn-on voltage of 2.5V, current density of 18.31 mA/cm$^2$ at an applied voltage of 6.0V, a brightness of 1,451 cd/m$^2$, a chromaticity of (0.31, 0.64), and an emission efficiency of 7.93 cd/A. An EL spectrum of the organic EL device is shown in FIG. 2.

COMPARATIVE EXAMPLE 1

An organic EL device was manufactured in the same manner as in Example 1 except that the electron transport layer was made of Alq$_3$ instead of Compound 1.

The organic EL device exhibited a turn-on voltage of 3.0V, a current density of 7.77 mA/cm$^2$ at an applied voltage of 6.0V, a brightness of 905.5 cd/m$^2$, a chromaticity of (0.30, 0.64), and an emission efficiency of 10.55 cd/A.

Figure 3:
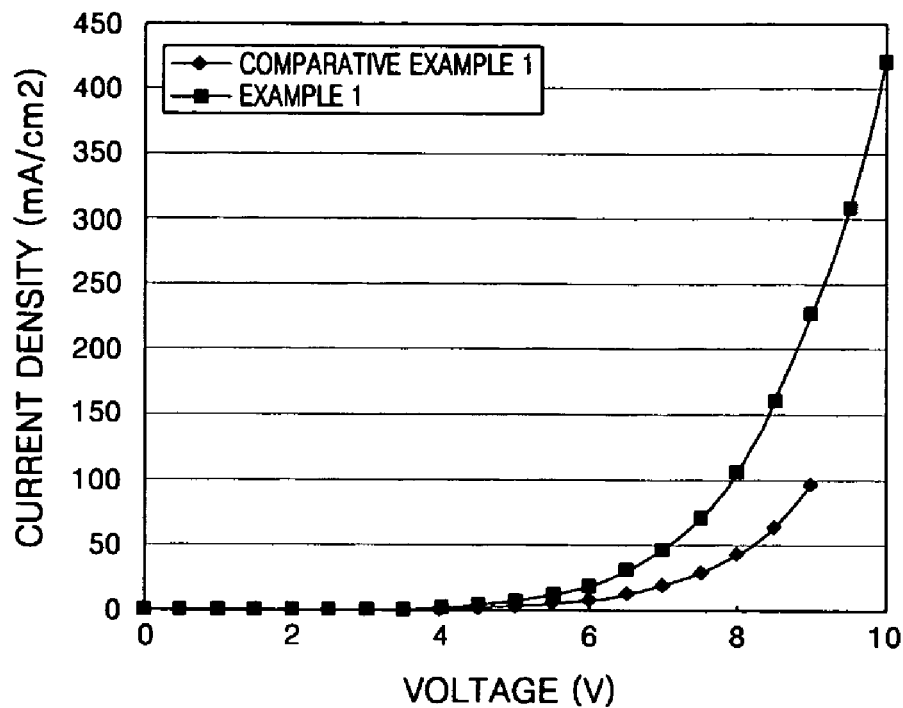
FIG. 3 shows a graph of the change in current density with respect to voltage for the organic EL devices of Example 1 of the present invention and Comparative Example 1.
Figure 4:
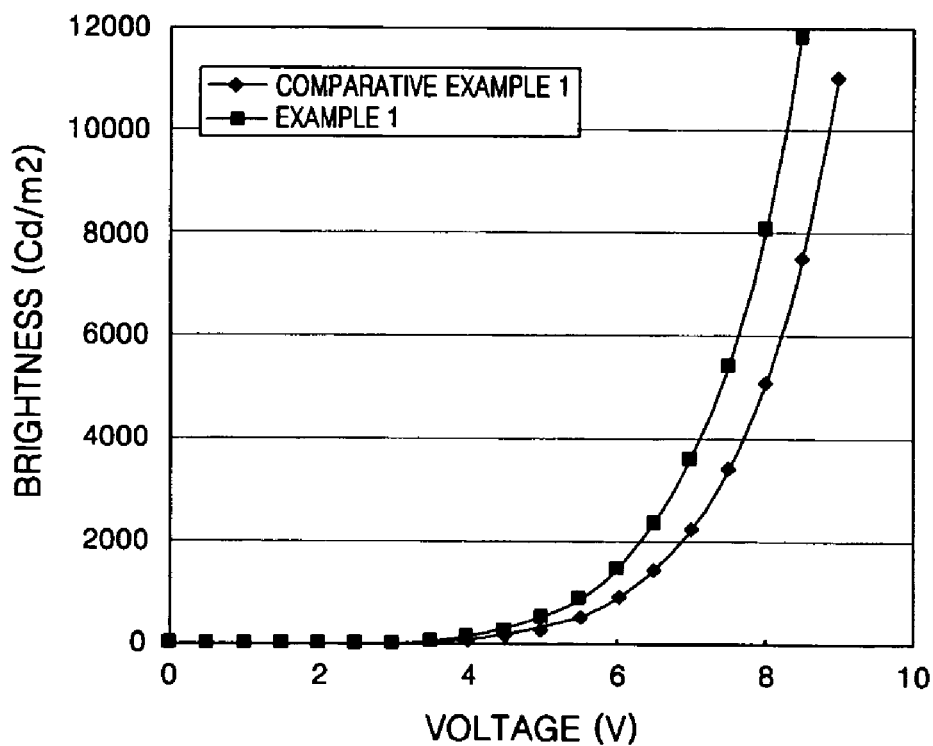
FIG. 4 shows a graph of the change in brightness with respect to voltage for the organic EL devices of Example 1 of the present invention and Comparative Example 1.

The organic EL device of Example 1, which used Compound 1 as the electron transport layer material, had better electron injection and transport capabilities, and thus exhibited a turn-on voltage that was 0.5V lower than the organic EL device of Comparative Example 1. The organic EL device of Example 1 exhibited an applied voltage that was 1V lower at the same current value, was brighter, and had a higher current density than the organic EL device of Comparative Example 1. Compound 1 thus provides a low power-consuming organic EL device that is brighter at a lower applied voltage under the same conditions as a conventional device. Comparative results for current density and brightness of the organic EL devices of Example 1 and Comparative Example 1 at the same applied voltage are illustrated in FIGS. 3 and 4, respectively.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A difluoropyridine-based compound represented by Formula 1 below:

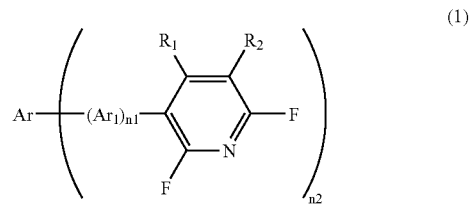

wherein Ar and Ar$_1$ are each selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

R$_1$ and R$_2$ are connected to form a ring or are each selected from the group of a hydrogen atom, halogen, a cyano group, a formyl group, a substituted alkyl group of 1-30 carbon atoms, an unsubstituted alkyl group of 1-30 carbon atoms, a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

n1 is an integer from 0 to 3; and n2 is an integer from 2 to 6.

2. The difluoropyridine-based compound of claim 1, wherein Ar and Ar$_1$ are each selected from the group of a phenyl group, a methylphenyl group, a trimethylphenyl group, an ethylphenyl group, an ethylbiphenyl group, an o-fluorophenyl group, an m-fluorophenyl group, a p-fluorophenyl group, a dichlorophenyl group, a dicyanophenyl group, a trifluoromethoxyphenyl group, an o-tolyl group, an m-tolyl group, a p-tolyl group, an o-cumenyl group, an m-cumenyl group and a p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a methylnaphthyl group, an anthracenyl group, an azulenyl group, a heptalenyl group, an acenaphthylenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a lower alkyl carbazolyl group, a biphenyl group, a lower alkyl biphenyl group, a lower alkoxy biphenyl group, a thiophenyl group, an indolyl group, and a pyridyl group.

3. The difluoropyridine-based compound of claim 1, wherein Ar and Ar$_1$ are each selected from the group of pyrazole, imidazole, oxazole, thiazole, 1,2,3-triazole, 1,2,4-triazole, tetrazole, oxadiazole, pyridine, pyridazine, pyrimidine, triazine, and derivatives thereof.

4. The difluoropyridine-based compound of claim 1, wherein $R_1$ and $R_2$ are each selected from the group of hydrogen, a substituted alkyl group of 1-15 carbon atoms and an unsubstituted alkyl group of 1-15 carbon atoms.

5. The difluoropyridine-based compound of claim 1, wherein Ar, $R_1$, $R_2$, and n2 are selected to form the difluoropyridine-based compounds represented by Formulae 2 through 6 below:

(2)
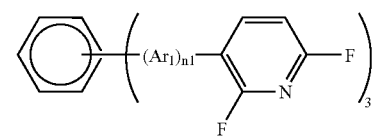

(3)
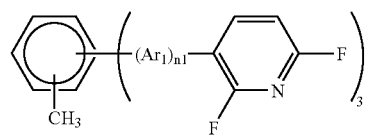

(4)
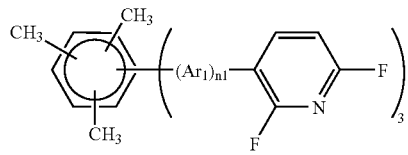

(5)
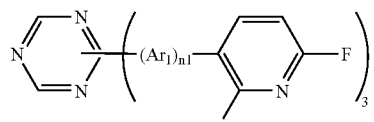

(6)
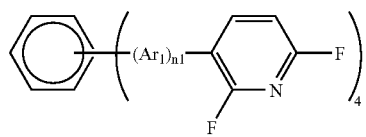

wherein $Ar_1$ is selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms; and n1 is an integer from 0 to 3.

6. The difluoropyridine-based compound of claim 5, wherein $Ar_1$ is selected from the group of:

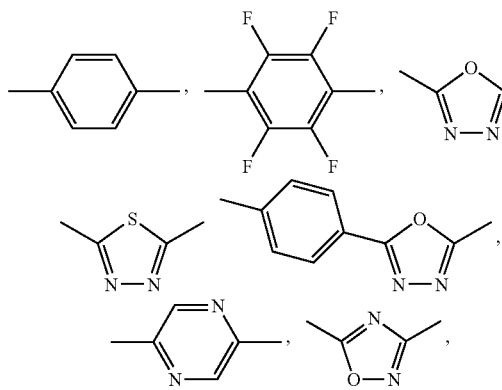

-continued

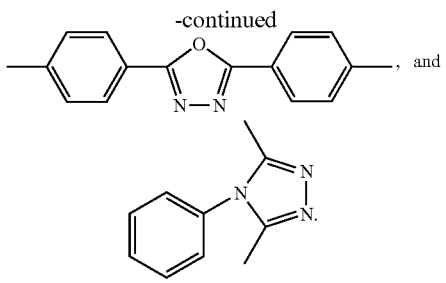
, and

7. The difluoropyridine-based compound of claim 1, wherein Ar, $R_1$, $R_2$, and n2 are selected to form the difluoropyridine-based compounds represented by Formulae 7-13 below:

(7)
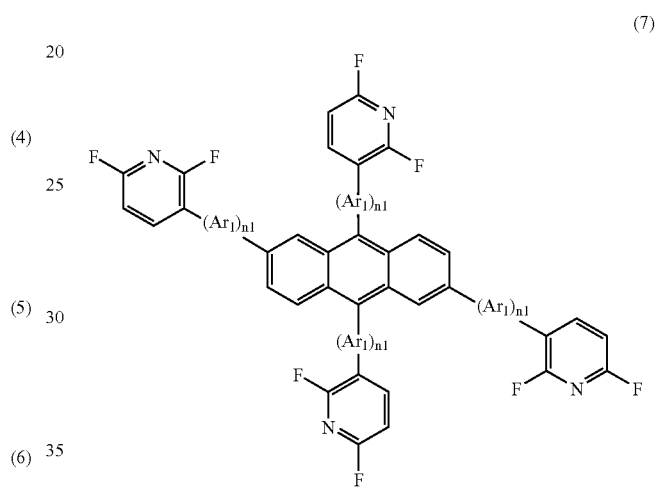

(8)
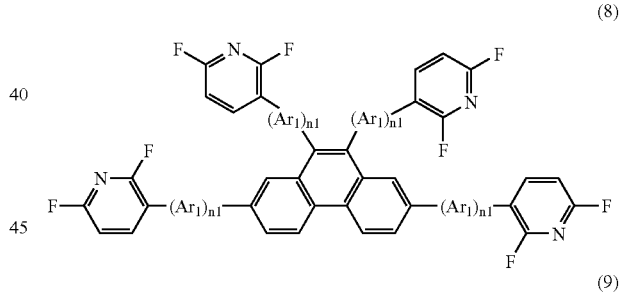

(9)
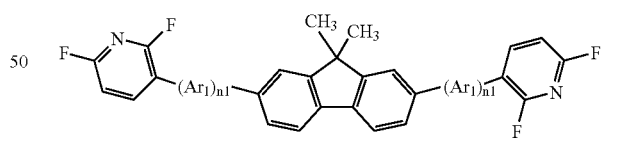

(10)

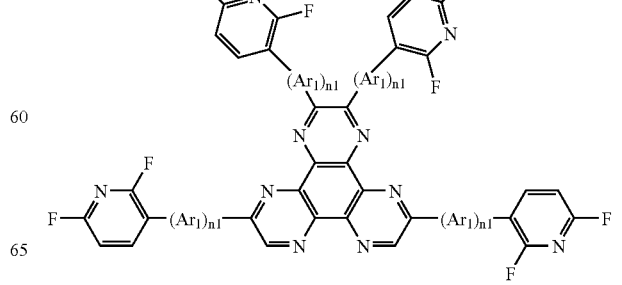

-continued

(11)
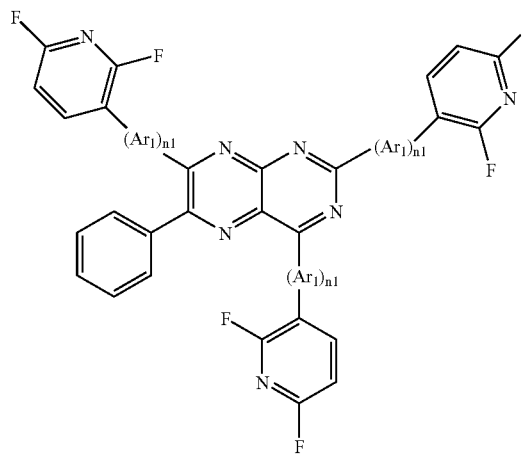

(12)
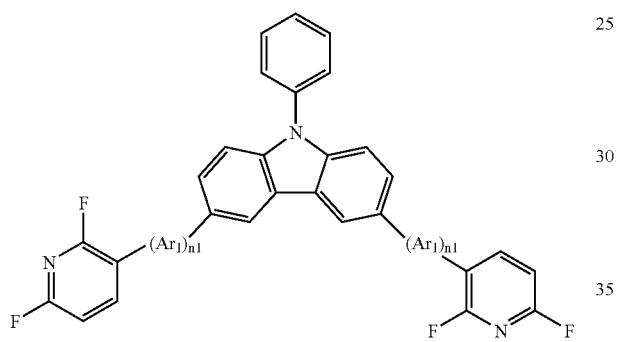

(13)
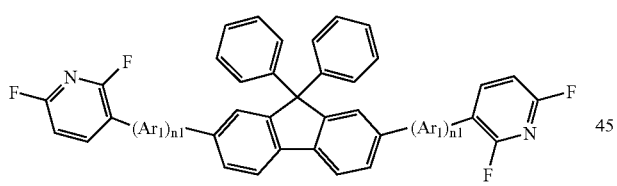

wherein $Ar_1$ is selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms; and n1 is an integer from 0 to 3.

8. The difluoropyridine-based compound of claim 7, wherein $Ar_1$ is selected from the group of:

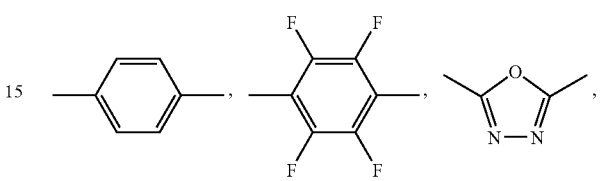

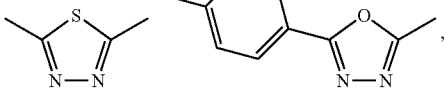

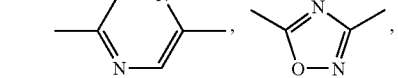

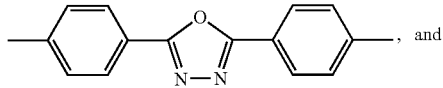

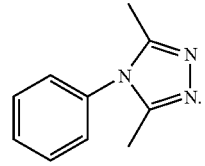

9. The difluoropyridine-based compound of claim 1, wherein Ar, $Ar_1$, $R_1$, $R_2$, n1 and n2 are selected to form the difluoropyridine-based compounds represented by Formulae 14 through 29 below:

(14)
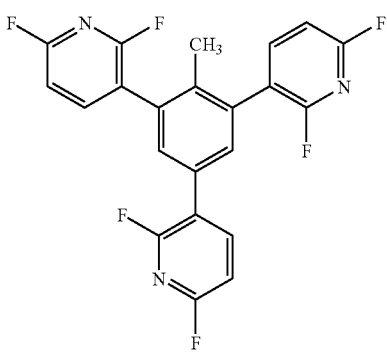

(15)
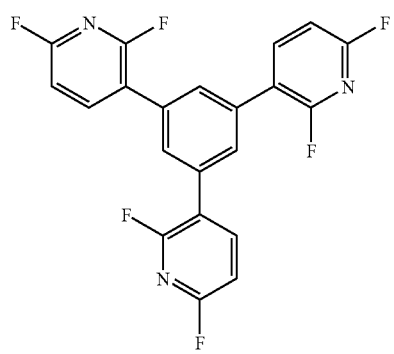

-continued
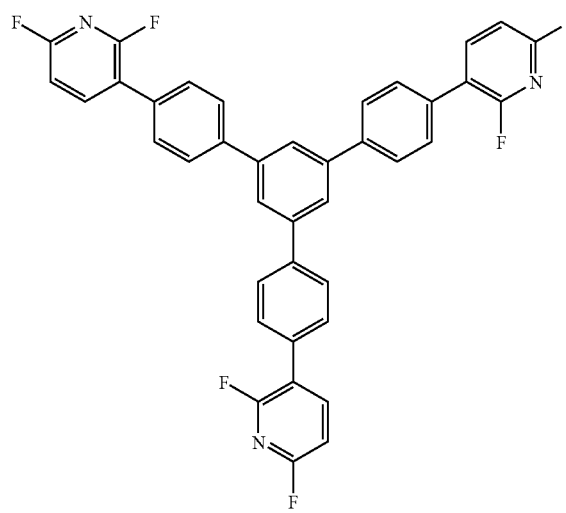
(16)
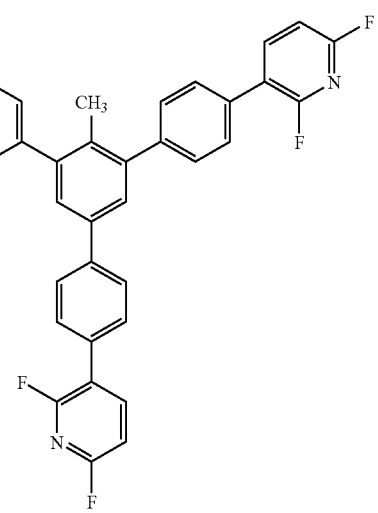
(17)
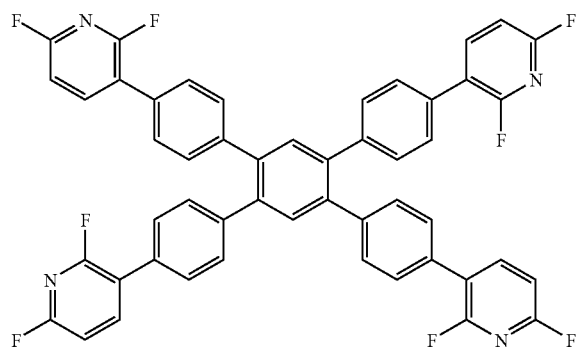
(18)
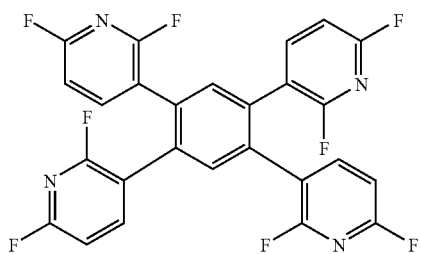
(19)
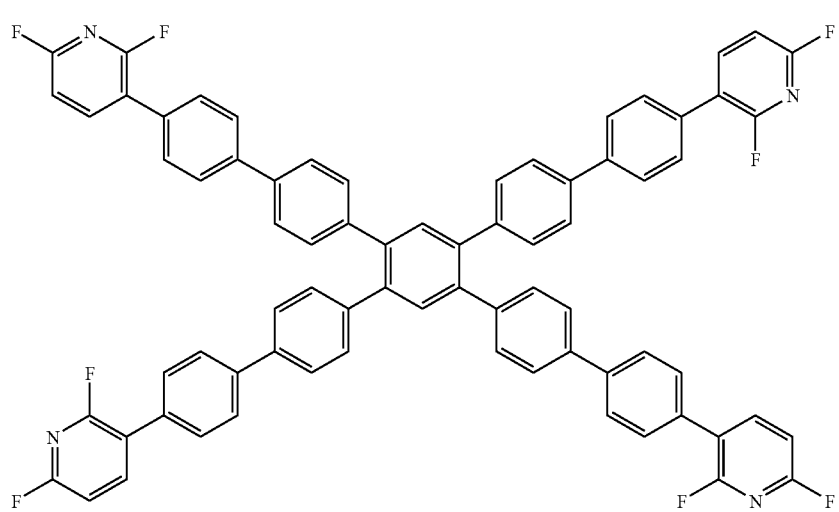
(20)

-continued
(21)
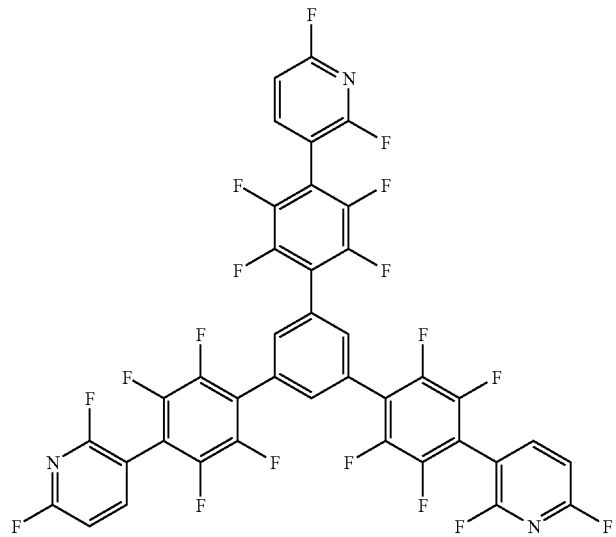
(22)
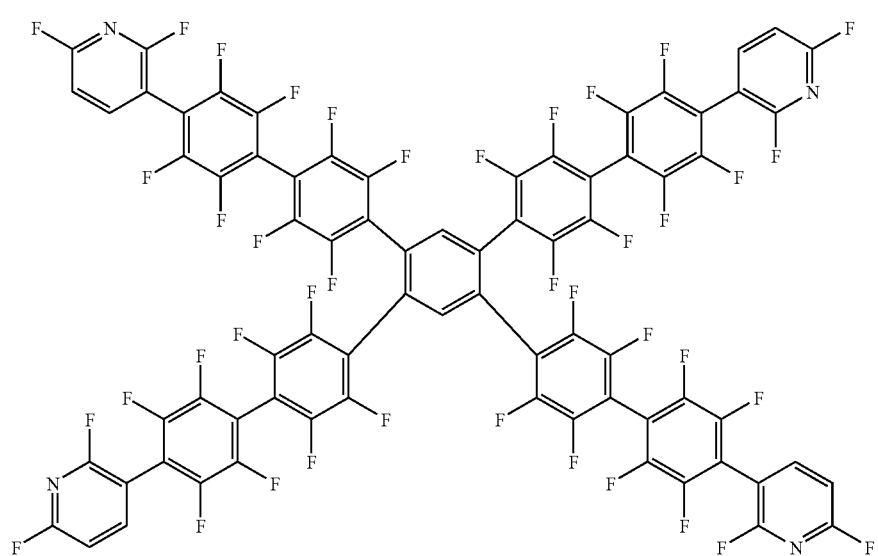
(23)
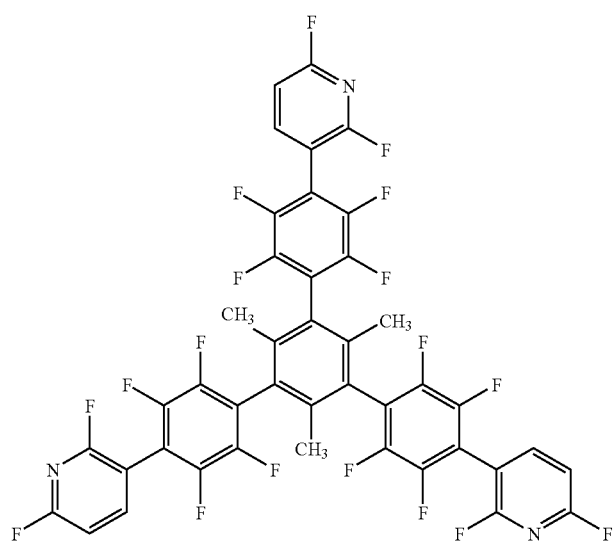

-continued
(24)
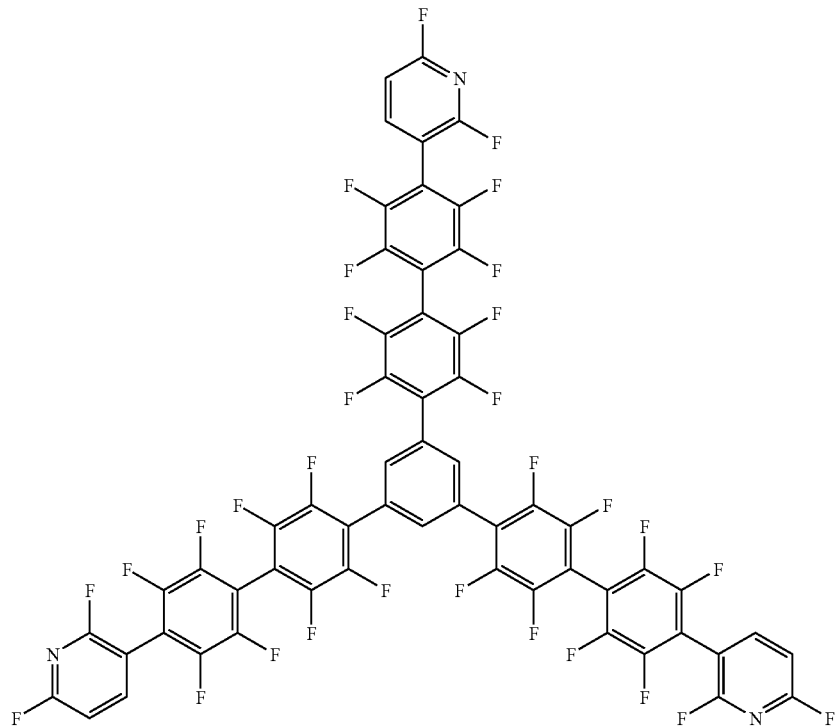
(25)
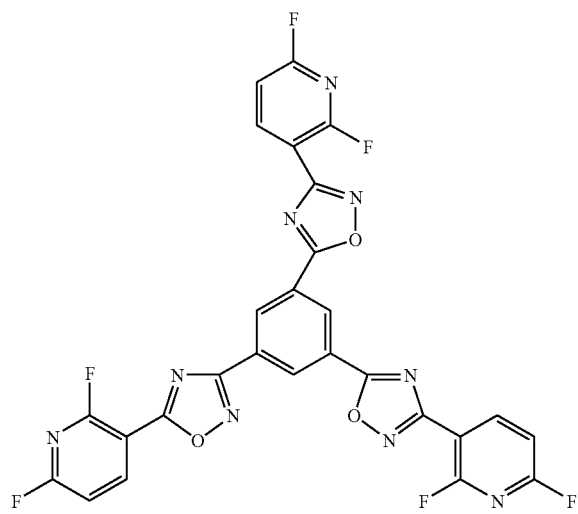

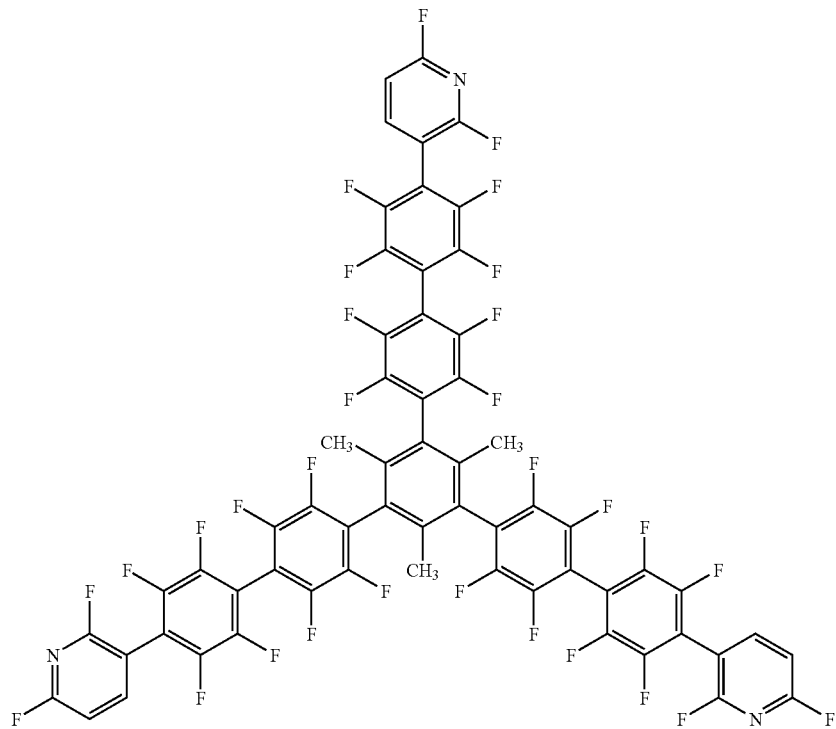
(26)
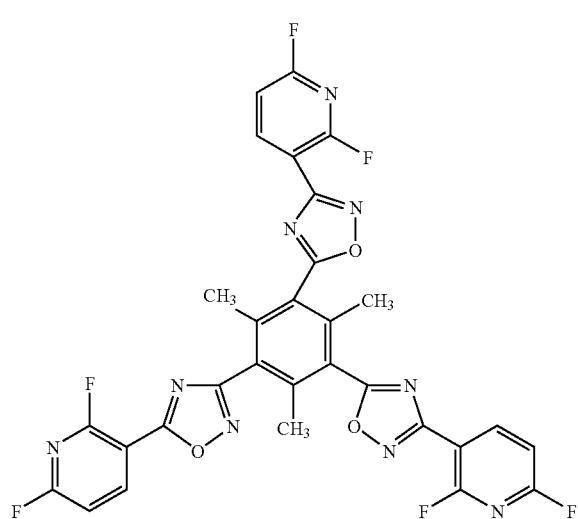
(27)

-continued (28)

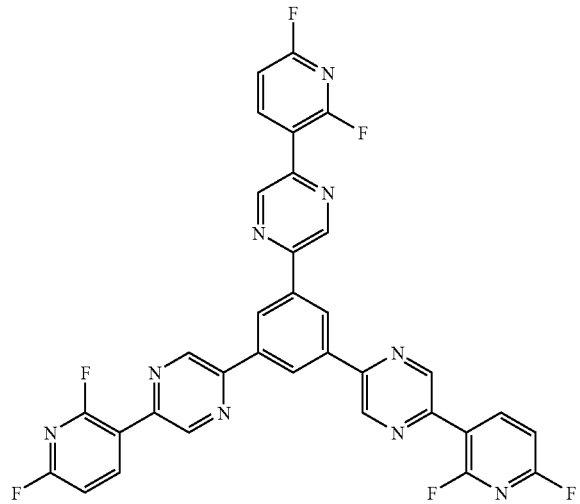

(29)

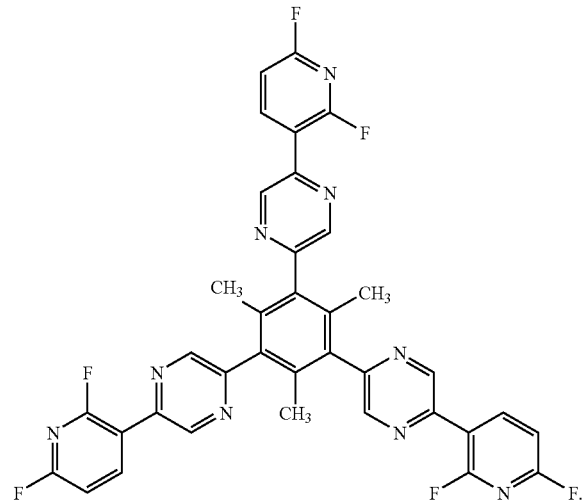

10. A method of preparing a difluoropyridine-based compound represented by Formula 1 below, comprising:
reacting a compound represented by Formula 1A below with a compound represented by Formula 1B or Formula 1C below:

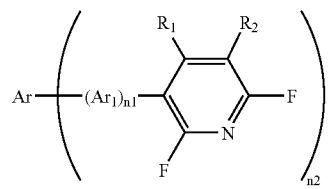

(1)

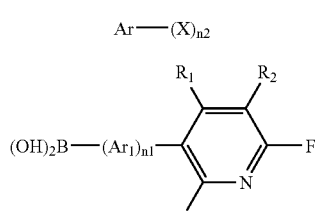

(1A)

(1B)

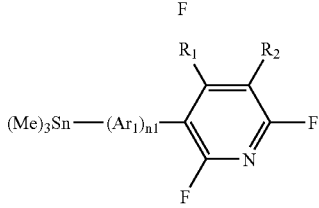

(1C)

wherein Ar and $Ar_1$ are each selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

X is a halogen compound;

$R_1$ and $R_2$ are connected to form a ring or are each selected from the group of a hydrogen atom, halogen, a cyano group, a formyl group, a substituted alkyl group of 1-30 carbon atoms, an unsubstituted alkyl group of 1-30 carbon atoms, a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

n1 is an integer from 0 to 3; and n2 is an integer from 2 to 6.

11. The method of claim 10,
wherein Ar and $Ar_1$ are each selected from the group of pyrazole, imidazole, oxazole, thiazole, 1,2,3-triazole, 1,2,4-triazole, tetrazole, oxadiazole, pyridine, pyridazine, pyrimidine, triazine, and derivatives thereof;

X is Br or Cl;

$R_1$ and $R_2$ are each selected from the group of hydrogen, a substituted alkyl group of 1-15 carbon atoms, and an unsubstituted alkyl group of 1-15 carbon atoms;

n1 is an integer from 0 to 2; and n2 is an integer from 3 to 4.

12. An organic electroluminescent (EL) device, comprising:
an organic layer positioned between a pair of electrodes,
wherein the organic layer comprises a difluoropyridine-based compound represented by Formula 1:

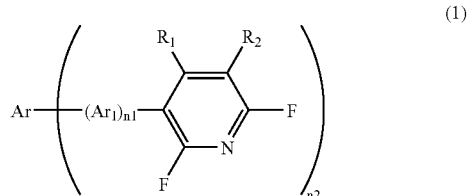

(1)

wherein Ar and $Ar_1$ are each selected from the group of a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

$R_1$ and $R_2$ are connected to form a ring or are each selected from the group of a hydrogen atom, halogen, a cyano group, a formyl group, a substituted alkyl group of 1-30 carbon atoms, an unsubstituted alkyl group of 1-30 carbon atoms, a substituted aryl group of 6-30 carbon atoms, an unsubstituted aryl group of 6-30 carbon atoms, a substituted heterocyclic compound of 4-30 carbon atoms, and an unsubstituted heterocyclic compound of 4-30 carbon atoms;

n1 is an integer from 0 to 3; and n2 is an integer from 2 to 6.

13. The organic EL device of claim 12, wherein the organic layer is an electron injection layer.

14. The organic EL device of claim 12, wherein the organic layer is an electron transport layer, a hole blocking layer, or an electron transport/hole blocking layer.

15. The organic EL device of claim 12, wherein the organic EL device has a structure selected from the group of first electrode/hole transport layer/light-emitting layer/electron transport layer/second electrode, first electrode/hole injection layer/hole transport layer/light-emitting layer/electron transport layer/electron injection layer/second electrode, and first electrode/hole injection layer/hole transport layer/light-emitting layer/hole blocking layer/electron transport layer/electron injection layer/second electrode.

* * * * *

UNITED STATES PATENT AND TRADEMARK OFFICE
CERTIFICATE OF CORRECTION

PATENT NO. : 7,582,366 B2  Page 1 of 1
APPLICATION NO. : 11/376323
DATED : September 1, 2009
INVENTOR(S) : Hwang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 652 days.

Signed and Sealed this

Fourteenth Day of September, 2010

David J. Kappos
*Director of the United States Patent and Trademark Office*